US006880560B2

(12) United States Patent
Ching et al.

(10) Patent No.: US 6,880,560 B2
(45) Date of Patent: Apr. 19, 2005

(54) SUBSTRATE PROCESSING APPARATUS FOR PROCESSING SUBSTRATES USING DENSE PHASE GAS AND SONIC WAVES

(75) Inventors: Gil Ching, Le bar sur Loup (FR); Vincent Perrut, Voreppe (FR); Vincent Ruch, Draguignan (FR); Gilles Fresquet, Castenet Tolosan (FR)

(73) Assignees: Techsonic, Antibes (FR); Recif, Inc., Aussonne (FR)

( * ) Notice: Subject to any disclaimer, the term of this patent is extended or adjusted under 35 U.S.C. 154(b) by 84 days.

(21) Appl. No.: 10/299,596

(22) Filed: Nov. 18, 2002

(65) Prior Publication Data

US 2004/0094183 A1 May 20, 2004

(51) Int. Cl.⁷ .................................................. B08B 6/00
(52) U.S. Cl. ........................ 134/1.3; 134/2; 134/10; 134/25.4; 134/25.5; 134/34; 134/36; 134/42; 134/902
(58) Field of Search ....................... 134/1.3, 2, 10, 134/25.4, 25.5, 34, 36, 42, 902

(56) References Cited

U.S. PATENT DOCUMENTS

| | | | |
|---|---|---|---|
| 2,498,990 A | | 2/1950 | Fryklund |
| 3,969,196 A | | 7/1976 | Zosel |
| 4,012,194 A | | 3/1977 | Maffei |
| 4,543,130 A | * | 9/1985 | Shwartzman ............... 134/1 |
| 4,944,837 A | | 7/1990 | Nishikawa et al. |
| 4,998,549 A | | 3/1991 | Bran |
| 5,013,366 A | | 5/1991 | Jackson et al. |
| 5,201,960 A | | 4/1993 | Starov |
| 5,213,619 A | | 5/1993 | Jackson et al. |
| 5,236,602 A | | 8/1993 | Jackson |
| 5,316,591 A | | 5/1994 | Chao et al. |

(Continued)

FOREIGN PATENT DOCUMENTS

| | | |
|---|---|---|
| EP | 0587169 B1 | 8/1995 |
| EP | 0587168 B1 | 3/1998 |
| EP | 0828020 A2 | 3/1998 |
| EP | 0992852 A2 | 4/2000 |
| EP | 1106946 A2 | 12/2000 |
| EP | 0828021 B1 | 1/2002 |
| JP | 60-192333 | 9/1985 |
| JP | 06-077118 | 4/1988 |
| JP | 63-179530 | 7/1988 |
| JP | 01-045131 | 2/1989 |
| JP | 01-286314 | 11/1989 |
| JP | 02-098928 | 4/1990 |
| JP | 03-127832 | 5/1991 |
| JP | 04-017333 | 1/1992 |
| JP | 05-047732 | 2/1993 |
| JP | 05-226311 | 9/1993 |
| JP | 06-126256 | 5/1994 |
| JP | 07-284739 | 10/1995 |
| JP | 08-100197 | 4/1996 |
| JP | 08-197021 | 8/1996 |
| JP | 08-206485 | 8/1996 |
| JP | 08-274055 | 10/1996 |
| JP | 09-232266 | 9/1997 |
| JP | 09-232271 | 9/1997 |
| JP | 10-024270 | 1/1998 |

(Continued)

Primary Examiner—Sharidan Carrillo
(74) Attorney, Agent, or Firm—Townsend and Townsend and Crew, LLP

(57) ABSTRACT

Embodiments of the invention are directed to substrate processing apparatuses and methods for processing substrates. In one embodiment, a substrate processing apparatus includes a processing chamber, a substrate holder inside of the processing chamber for holding a substrate, and a sonic box in the processing chamber for supplying sonic waves substantially perpendicularly to the substrate. The sonic box may comprises a membrane, and a transducer coupled to the membrane.

15 Claims, 3 Drawing Sheets

U.S. PATENT DOCUMENTS

| | | | |
|---|---|---|---|
| 5,337,446 A | 8/1994 | Smith et al. | |
| 5,339,844 A | 8/1994 | Stanford, Jr. et al. | |
| 5,344,493 A | 9/1994 | Jackson | |
| 5,412,958 A | 5/1995 | Iliff et al. | |
| 5,456,759 A | 10/1995 | Stanford, Jr. et al. | |
| 5,494,526 A | 2/1996 | Paranjpe | |
| 5,501,761 A | 3/1996 | Evans et al. | |
| 5,505,219 A | 4/1996 | Lansberry et al. | |
| 5,514,220 A | 5/1996 | Wetmore et al. | |
| 5,522,938 A | 6/1996 | O'Brien | |
| 5,526,834 A | 6/1996 | Mielnik et al. | |
| 5,700,379 A | 12/1997 | Biebl | |
| 5,730,874 A | 3/1998 | Wai et al. | |
| 5,772,783 A | 6/1998 | Stucker | |
| 5,789,705 A | 8/1998 | Cancellieri et al. | |
| 5,873,948 A | 2/1999 | Kim | |
| 5,908,510 A | 6/1999 | McCullough et al. | |
| 5,944,996 A | 8/1999 | DeSimone et al. | |
| 5,965,025 A | 10/1999 | Wai et al. | |
| 5,976,264 A | 11/1999 | McCullough et al. | |
| 6,067,728 A | 5/2000 | Farmer et al. | |
| 6,085,762 A | 7/2000 | Barton | |
| 6,092,538 A | 7/2000 | Arai et al. | |
| 6,106,474 A * | 8/2000 | Koger et al. | 600/459 |
| 6,114,044 A | 9/2000 | Houston et al. | |
| 6,165,560 A | 12/2000 | McClain et al. | |
| 6,176,895 B1 | 1/2001 | DeSimone et al. | |
| 6,224,774 B1 | 5/2001 | DeSimone et al. | |
| 6,228,563 B1 | 5/2001 | Starov et al. | |
| 6,240,936 B1 | 6/2001 | DeSimone et al. | |
| 6,242,165 B1 | 6/2001 | Vaartstra | |
| 6,277,753 B1 | 8/2001 | Mullee et al. | |
| 6,286,231 B1 | 9/2001 | Bergman et al. | |
| 6,306,564 B1 | 10/2001 | Mullee | |
| 2002/0096578 A1 * | 7/2002 | Al-Jiboory | 239/102.1 |
| 2003/0062071 A1 * | 4/2003 | Sorbo et al. | 134/184 |
| 2004/0094183 A1 * | 5/2004 | Ching et al. | 134/1.3 |

FOREIGN PATENT DOCUMENTS

| | | |
|---|---|---|
| JP | 10-043702 | 2/1998 |
| JP | 10-050648 | 2/1998 |
| JP | 10-094767 | 4/1998 |
| JP | 10-163152 | 6/1998 |
| JP | 10-165911 | 6/1998 |
| JP | 10-209101 | 8/1998 |
| JP | 10-260537 | 9/1998 |
| JP | 11-087306 | 3/1999 |
| JP | 11-090362 | 4/1999 |
| JP | 11-156311 | 6/1999 |
| JP | 11-216437 | 8/1999 |
| JP | 2000-108358 | 4/2000 |
| JP | 2000-340540 | 12/2000 |
| JP | 2000-357686 | 12/2000 |
| TW | 318151 A | 10/1997 |
| WO | WO 84/02291 A1 | 6/1984 |
| WO | WO 94/01227 A1 | 1/1994 |
| WO | WO 94/01613 A1 | 1/1994 |
| WO | WO 99/48624 A1 | 9/1999 |
| WO | WO 00/01871 A1 | 1/2000 |
| WO | WO 01/17699 A1 | 3/2001 |
| WO | WO 01/22016 A1 | 3/2001 |
| WO | WO 01/46999 A2 | 6/2001 |
| WO | WO 01/55628 A1 | 8/2001 |
| WO | WO 01/78911 A1 | 10/2001 |
| WO | WO 01/87505 A1 | 11/2001 |
| WO | WO03028909 A1 * | 4/2003 |
| WO | WO 04/045739 A3 | 6/2004 |

* cited by examiner

SUBSTRATE PROCESSING APPARATUS FOR PROCESSING SUBSTRATES USING DENSE PHASE GAS AND SONIC WAVES

BACKGROUND OF THE INVENTION

Various patents and publications describe substrate processing apparatuses that use sonic energy and fluids for processing substrates.

U.S. Pat. No. 5,456,759 describes a substrate processing apparatus that uses transducers placed directly inside of a processing chamber to produce sonic energy. The processing chamber includes a liquid gas.

However, the substrate processing apparatus described in U.S. Pat. No. 5,456,759 has some disadvantages. Piezoelectric transducers have bad corrosion resistance and deteriorate quickly when they come into contact with liquid gases. Corroding transducers can produce contaminants, which can undesirably deposit on the substrates being processed.

U.S. Pat. No. 6,228,563 discloses a substrate processing apparatus that uses a sonotrode to generate acoustic waves. A sonotrode is a rod, which is placed through the wall of a processing chamber of a substrate processing apparatus. Outside of the processing chamber, piezoelectric transducers transmit their vibrations to the rod, which transmits energy to a fluid inside of the processing chamber.

The system described U.S. Pat. No. 6,228,563 has some disadvantages. First, it is difficult to obtain a high pressure sealing between the processing chamber and the sonotrode without absorbing most of the sonic energy. The sonotrode's vibrations dangerously decrease the life-time of this sealing system. Second, the sonotrode emits vibrations in all directions. It is difficult to control the sonic waves produced by the sonotrode, particularly at its end. It has been demonstrated that the waves are the strongest at the sonotrode's end and these waves can damage, for example, a pattern on a semiconductor wafer.

U.S. Pat. No. 5,522,938 describes a substrate processing apparatus where megasonic acoustic waves are generated using an antenna that is oriented perpendicular to the orientation of the substrate. In this way, the generated acoustic waves travel along the wafer resulting in a streaming effect.

The system described in U.S. Pat. No. 5,522,938 has some disadvantages. First, it is difficult to produce waves of the type mentioned in U.S. Pat. No. 5,522,938 uniformly onto the width of the substrate. It is also difficult to do so in a cylindrical processing chamber. The cylindrical geometry of the processing chamber is dictated by the high processing pressures inside of the processing chamber. Second, in U.S. Pat. No. 5,522,938, the pressure that is used is at the critical value so that the fluid can oscillate between gas phase and the supercritical state. This is not very efficient. There is no real phase change between the gas phase and supercritical state of a fluid, because variations in the fluid's characteristics (e.g., density, surface tension, etc.) are very small if the pressure variation is also small.

Accordingly, improved substrate processing apparatuses and methods using dense phase gases and sonic energy are desirable. Embodiments of the invention address the above problems and other problems, individually and collectively.

SUMMARY OF THE INVENTION

Embodiments of the invention are directed to substrate processing apparatuses and methods for processing substrates. In embodiments of the invention, dense phase gases such as supercritical fluids can be used in combination with sonic energy (e.g., megasonic acoustic waves) to process substrates such as semiconductor wafers.

One embodiment of the invention is directed to a substrate processing apparatus comprising: a) a processing chamber; b) a substrate holder inside of the processing chamber for holding a substrate; and c) a sonic box in the processing chamber for supplying sonic waves substantially perpendicularly to the substrate, the sonic box comprising i) a membrane, and ii) a transducer coupled to the membrane.

Another embodiment of the invention is directed to a method for processing a substrate, the method comprising: a) introducing a substrate into a processing chamber; b) introducing a dense phase gas into the processing chamber; c) producing sonic energy substantially perpendicularly to the substrate inside of the processing chamber using a sonic box having a transducer coupled to a membrane; and d) processing the substrate using the sonic energy and the dense phase gas.

Another embodiment of the invention is directed to a sonic box to be used in a processing chamber, the sonic box comprising: a) body; b) a membrane attached to the body, wherein the membrane and the body form an enclosure; c) a transducer coupled to the membrane; and d) an incompressible liquid inside of the enclosure.

These and other embodiments of the invention will be described in further detail low.

DETAILED DESCRIPTION

Figure 1A:
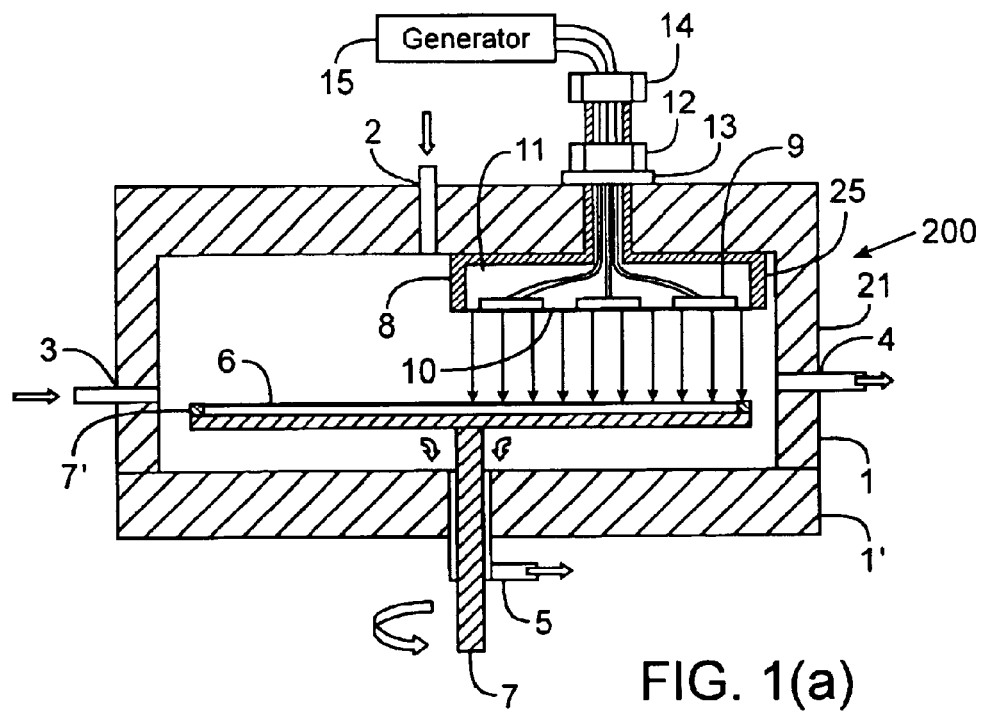
FIG. 1(a) shows a side cross-sectional view of a substrate processing apparatus according to an embodiment of the invention.

Embodiments of the invention are directed to substrate processing apparatuses and systems that use dense phase gases at high pressure. A "dense phase gas" is a gas that is present at either supercritical or subcritical conditions to achieve liquid-like densities. Examples of dense phase gases include supercritical fluids and liquefied gases. The dense phase gases are preferably activated by sonic energy such as power megasonic waves. Embodiments of the invention can be used in various cleaning operations and chemistry processes. Other potential applications for embodiments of the invention are described below.

As will be explained in further detail below, embodiments of the invention use a sonic box to produce sonic energy that is used with a dense phase gas to process substrates. The sonic energy is in the inaudible range. For example, the frequency of the sonic energy being used may be greater than about 20,000 Hertz in embodiments of the invention. In some embodiments, the frequency of the sonic energy that could be used to process substrates can vary from ultrasonic to megasonic. The latter allows ever-smaller particles to be removed from a substrate. Preferably, the sonic energy has a frequency between about 100 kHz and about 3 MHz. This frequency range includes the megasonic frequency range.

Ultrasonic energy in the form of ultrasonic baths has been used to clean substrates. Ultrasonic baths use cavitation as a cleaning mechanism. Because of the fragility of some substrates such as silicon wafers, it is desirable to reduce the wavelength of the sonic energy when cleaning substrates. Sonic waves with smaller wavelengths and higher frequencies can pass into smaller structures and can remove smaller particles from the substrates.

At high frequencies, sonic energy that is produced by the transducers produces a "softer" cavitation of dissolved gas bubbles. Moreover, the acoustic boundary layer is at a value of about 0.1 micrometer on the surface of the substrate being treated in liquids and tends to zero in supercritical fluids, and this increases the interfacial reaction kinetics. These conditions are desirable, especially when the substrates being processed are fragile.

As noted, in embodiments of the invention, dense phase gases such as supercritical fluids and liquefied gases are used in conjunction with sonic energy to process substrates. The use of ordinary liquids is a problem when processing, for example, nanoporous materials, because a drying step is usually involved. Strong mechanical stress is exerted by capillary forces during the elimination of the liquid from a nanoporous material. These forces can damage the structures of some microsystems, and nanoporous materials can not be dried efficiently and effectively. The use of dense phase gases such as supercritical fluids and liquefied gases solves these drying problems and reduce the acoustic boundary layer.

The dense phase gases that are used to process substrates are preferably supercritical fluids. The supercritical state of a compound is attained when it is subjected to a pressure above its critical pressure Pc and to a temperature above its critical temperature Tc. For example, carbon dioxide has a critical pressure of 74 bars and a critical temperature of 31° C. Accordingly, supercritical carbon dioxide would be at a pressure above 74 bars and above 31° C. In general, the physical properties of a supercritical fluid can include the following: (1) density close to liquids: $0.2<d<1$; (2) viscosity close to gases: $10^{-2}<\eta$ (cp)$<10^{-1}$; and (3) properties in-between gas and liquid self-diffusivity coefficient: $10^{-4}<D$ (cm$^2$/s)$<10^{-3}$. As an alternative to supercritical fluids, subcritical fluids (P>Pc, T<Tc) or two-phase liquid-gas fluids could also be used in embodiments of the invention.

Any suitable type of dense phase gas can be used in embodiments of the invention. Specific examples of suitable substances include ammonia, nitrous oxide, carbon dioxide, hydrocarbons, halogenated hydrocarbons, and light hydrocarbons. Ethers such as dimethyl ether ($CH_3$—O—$CH_3$) could also be used. Despite its strong flammability and high critical temperature, dimethyl ether is a strong solvent and has a high affinity with water (contrary to carbon dioxide). Carbon dioxide is a preferred supercritical fluid, as its supercritical state is easily obtained. It is also non-toxic, environmentally friendly, non-flammable and its solvent properties are comparable to hexane. Any of the above materials may be pure or mixed with other materials.

Additives (e.g., polar solvents such as ethanol or propylene carbonate) can be included in the dense phase gas along with, for example, a supercritical fluid to increase the processing efficiency of the supercritical fluid. Such additives may be referred to as "co-solvents" in some instances.

Any suitable additive may be used in embodiments of the invention. Suitable additives include organic solvents such as alcohols (e.g., ethanol or isopropyl alcohol), esters, ketones, lactones (e.g., gamma-butyrolactone), ethers, tertiary amines, di-substituted amides, ureas, acetates, tetrahydrofurane, dioxane, sulphoxides (e.g., dimethyl sulphoxide), and sulfites. Other examples of suitable solvents include: organic liquefied gases such as ethers; amines; oxidation agents such as oxygen, ozone, hydrogen peroxide, and ammonium persulfate; quaternary ammoniums such as trimethylamine and triethylamine; surfactants; chelating agents like trifluoroacetylacetone, and hexafluoroacetylacetone; and water. Yet other examples of suitable additives include: organic acids such as carboxylic or di-carboxylic acids (e.g., citric acid, oxalic acid, dipropanoic acid, etc.); sulphenic acids; sulphonic acids (e.g., methanesulfonic acid, trifluorosulfonic acid, etc.); mineral acids dissolved in water or in solvents; acids such as HF, or $NH_4F$ in water or in an alcohol; mineral bases dissolved in water or solvents; and $NH_3$.

The dense phase gas (with or without additives) may be homogeneous or inhomogeneous. Pressure and temperature conditions can be set so that two phases co-exist, such as when a supercritical gas-rich phase and a liquid solvent-rich phase co-exist together. These conditions can be determined by studying phase diagrams.

Any suitable substrate can be processed using embodiments of the invention. For example, suitable substrates include wafers such as semiconductor wafers, discs of silicon, glass, gallium arsenide or other materials, stacks of materials, circuit boards, optical disks, etc. The substrates may include integrated circuits, Microsystems, microsensors or other microscopic elements produced using photolithography. The substrates may have microporous materials, or may have microporous layers may be formed on them.

The process that is performed with the dense phase gas and the sonic energy may be, for example, a cleaning, dissolution, or drying operation. The process may additionally or alternatively include one or many chemical reactions. Some processes include: photosensitive resist development during photolithography; photosensitive resist stripping after development; removal of any other residue of organic materials; polymer removal including polymer etch process by-product removal; particle removal processes such as processes that remove particles generated during chemical mechanical polishing (CMP) or that remove particles brought in by the environment or other manufacturing processes; cleaning and/or drying of microporous materials; micro-machining; and sacrificial layer etch processes used for MEMS (Micro Electro Mechanical System) manufacturing.

The apparatuses according to embodiments of the invention generate sonic waves in a dense phase gas under high pressure using a sonic box that has a membrane that is generally parallel to the orientation of the substrate. Transducers are placed on the membrane. The membrane physically separates the dense phase gas and the substrates being processed from the transducers. Accordingly, potential contaminants from the transducers (e.g., corroding material from the transducers) do not contaminate the substrates being processed, since the transducers are physically separated from the substrates. This reduces the risk of contamination and also reduces the risk of producing defective substrates.

FIG. 1(a) shows a substrate processing apparatus 200 according to an embodiment of the invention. The substrate processing apparatus 200 includes a processing chamber 21 for processing a substrate 6 such as a wafer. One substrate 6 is shown for illustration. It is understood that in other embodiments, there can be many substrates in a single processing chamber.

In this example, the processing chamber 21 includes two cylindrical portions 1 and 1'. The cylindrical portions 1 and 1' may be coated or uncoated, and may comprise stainless steel or any other material having good corrosion resistance and high mechanical strength. Inside of the processing chamber 21, the treatment zone for the substrate 6 is a cylindrical cavity, which is partially defined by one of the chamber portions 1. To open the processing chamber 21, the upper portion 1 could be lifted, and/or the lower portion 1' could be lowered to separate them and allow access into the interior of the processing chamber 21.

The processing chamber 21 can operate at any suitable pressure and at any suitable temperature. For example, the processing chamber 21 can operate at a pressure between about 50 and about 500 bar in some embodiments of the invention. The processing chamber 21 may also operate at a temperature between about 0° C. and about 150° C. in some embodiments of the invention.

A dense phase gas such as a supercritical fluid can be injected through one or more inlets 2, 3. The dense phase gas can be introduced to the substrate 6 from above the substrate 6 and/or from the side of the substrate 6. After contacting the substrate 6, the dense phase gas passes downstream of the substrate 6 and out of the processing chamber 21 through a side outlet 4 and/or a bottom outlet 5. Although two inlets and two outlets are shown and described with respect to FIG. 1(a), it is understood that the number of inlets and outlets can be greater than or less than two in other embodiments of the invention.

In FIG. 1(a), the substrate 6 is fixed on a substrate holder in the form of a rotating gripper 7. In the illustrated example, the substrate 6 is maintained by the edge-grips 7' so that contact with the surface of the substrate 6 is minimized. By edge-gripping the substrate 6, the likelihood of contamination or damage due to contact with the faces of the substrate 6 is reduced. Additionally, the backside of the substrate 6 can be totally wetted by the dense phase gas when the substrate 6 is gripped by its edges.

The rotating gripper 7 can rotate at any suitable speed. For example, in some embodiments, the rotating gripper 7 can rotate at a speed between 1 and 3000 rounds per minute. In other embodiments, the rotation speed of the rotating gripper 7 can be greater or less than these values. By rotating the substrate 6, all areas of the substrate 6 can receive sonic energy from the sonic box 25 above it. Also, by rotating the substrate 6, the dense phase gas in the processing chamber 21 is agitated. Agitating the dense phase gas can help process the substrate 6 by providing a fresh supply of dense phase gas near the surface of the substrate 6.

Sonic energy such as megasonic acoustic energy is transmitted to the dense phase gas inside of the processing chamber 21 using a sonic box 25 that is positioned just opposite to the front side of the substrate 6. In this example, the sonic box 25 is fixed to the upper chamber portion 1 with a nut 12 that is locked on a washer 13. A flat seal ensures sealing between the sonic box 25 and the upper chamber portion 1. When a dense phase gas is in the processing chamber 21, the sonic box 25 may be immersed in the dense phase gas.

In this example, the sonic box 25 comprises a body 8 having an open region and a thin membrane 10. The thin membrane 10 is fixed to the body 8 and together they form an enclosure. An incompressible fluid 11 is inside of the formed enclosure.

As shown in FIG. 1(a), sonic energy is directed from the sonic box 25 to the substrate 6 in a direction that is substantially perpendicular to the orientation of the substrate 6. The membrane 10 can act as a sonic energy transmitter to the dense phase gas and it can be attached to the body 8 in any suitable manner. For example, the membrane 10 can be fixed by jaws screwed to the body 8 with an adapted sealing system, or it can be directly welded to the body 8.

The membrane 10 may have any suitable characteristics. For example, the membrane 10 may have good chemical compatibility (e.g., corrosion resistance and hence no contamination of the substrate being processed) with the dense phase gas and with the incompressible liquid 11, good acoustic properties (e.g., vibratory modes), and the flexibility to absorb pressure variations.

The membrane 10 may include any suitable material. Preferably, the membrane 10 comprises a metallic sheet or quartz. The metallic sheet may include pure metal or a metal alloy. An example of a suitable material is phynox (a Ni—Cr—Co alloy) produced by Imphy Ugine Precision, in Ugine, France. The membrane 10 can also have any suitable thickness. For example, the thickness of the membrane 10 may be between about 0.1 and about 5 millimeters in some embodiments. The thickness can be greater than or less than these specific thicknesses in other embodiments of the invention.

The transducers 9 can be attached to the membrane 10 in any suitable manner. For example, an adhesive may be used to adhere the transducers 9 to the membrane 10. The number of transducers 9 and the dimensions of the transducers 9 can depend upon the dimensions of the membrane 10 and the desired distribution of sonic energy. The geometries of the different transducers 9 can be the same or different (parallelepipeds, cylinders, etc.) in embodiments of the invention.

The transducers 9 can be magnetostrictive transducers or can have mono-crystals, but are preferably piezoelectric transducers such as lead zirconate titanate (PZT) transducers. Suitable transducers are commercially available from Morgan Matroc (UK), for example. The emitted power of the transducers 9 can be between 1 and 100 watt/cm$^2$ in some embodiments. The transducers 9 can have a resonance frequency between 100 kHz and 3 MHz. Magnetostrictive transducers at a frequency of about 20 kHz or more could alternatively be used.

As noted, the sonic box 25 may be filled with an incompressible liquid 11 to add support to the membrane 10. The incompressible liquid 11 may be substantially incompressible, be an electric insulator and may have a low coefficient of thermal expansion, good acoustic dissipation properties, and good thermal dissipation properties. In addition to supporting the membrane 10, the incompressible liquid 11 absorbs the energy emitted by the backsides of the transducers 9. Examples of incompressible liquids 11 include synthetic oils such as those used in high temperature hydraulic systems, gels, xerogels, and aerogels.

A generator 15 can electrically stimulate the transducers 9. Electrical signals are sent by the generator 15 and are transmitted by using two or more electric cables passing through the body 8 and the high-pressure sealed connector 14. The generator 15 may comprise any suitable power source.

The size and geometry of the sonic box 25 can vary to optimize the acoustic energy distribution. However, in this example, the length of the sonic box 25 is preferably at least equal to the radius of the substrate 6 so that the totality of the surface of the substrate 6 receives sonic energy when the substrate 6 spins.

Figure 1B:
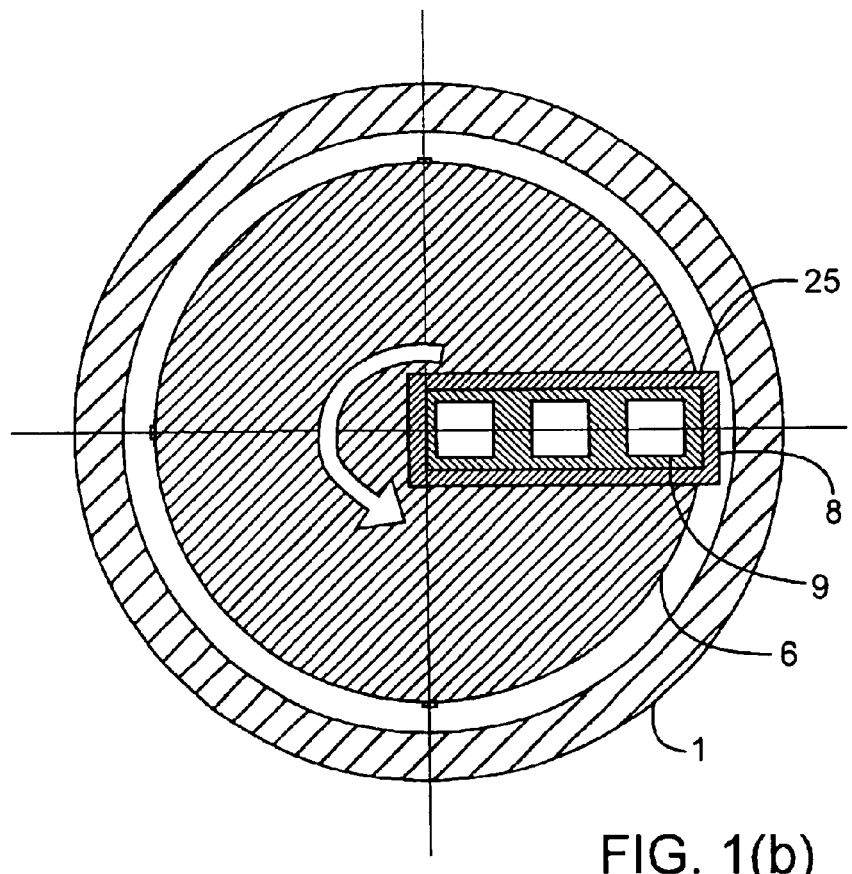
FIG. 1(b) shows a horizontal cross-sectional view of the substrate processing apparatus shown in FIG. 1(a).

Referring to FIG. 1(b), the sonic box 25 includes three transducers 9 in this example. As shown, the sonic box 25 may remain stationary, while the substrate 6 rotates (e.g., counterclockwise) beneath it. Although 3 transducers 9 in a linear arrangement are illustrated, it is understood that the number and arrangement of transducers may be different in other embodiments.

The dense phase gas inside of the processing chamber 21 or the substrate 6 can also be heated. Heating can be accomplished in any number of ways. For example, heated air or a heating fluid may supply heat to the interior of the processing chamber. For instance, the processing chamber 21 and/or the rotating gripper 7 can be provided with fluid passages (not shown) for a heat exchange fluid. Alternatively, an electrically resistive heater (not shown) may be used to supply heat to the dense phase gas in the processing chamber 21 or the substrate 6.

Figure 2A:
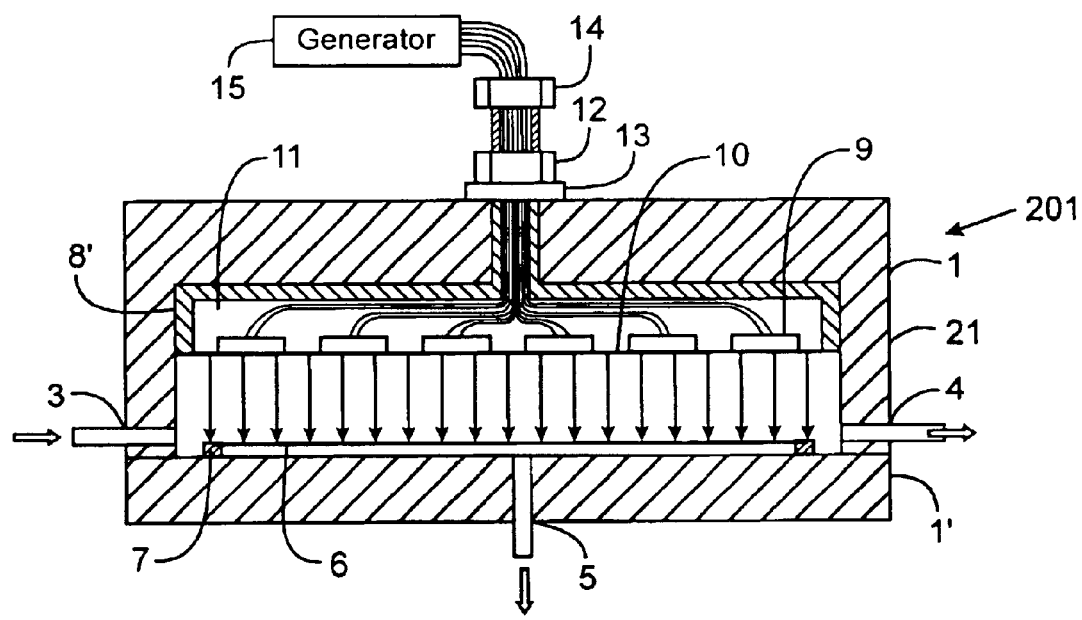
FIG. 2(a) shows a side cross-sectional view of a substrate processing apparatus according to another embodiment of the invention.
Figure 2B:
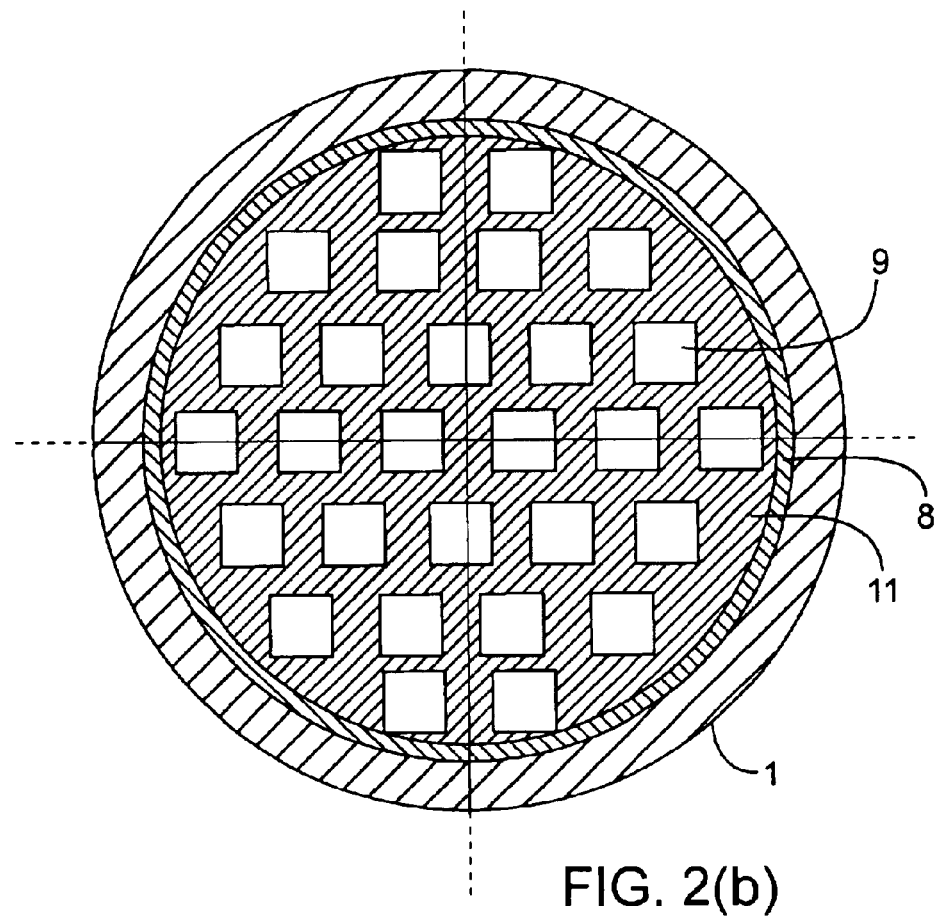
FIG. 2(b) shows a horizontal cross-sectional view of the substrate processing apparatus shown in FIG. 2(a).

Another substrate processing apparatus 201 according to an embodiment of the invention is shown in FIGS. 2(a) and 2(b). In FIGS. 1(a), 1(b), 2(a), and 2(b), like numerals designate like elements and the description of like elements is herein incorporated by reference.

The substrate processing apparatus 201 shown in FIGS. 2(a) and 2(b) does not contain a rotating gripper for the substrate 6. Rather, the substrate holder in the form of a gripper 7 in FIG. 2(a) holds the substrate 6 in a stationary position. Also, the sonic box 8' is generally designed according to the same principle as the sonic box 8 shown in FIGS. 1(a) and 1(b). However, unlike the box 8 shown in FIGS. 1(a) and 1(b), the sonic box 8' in the substrate processing apparatus 201 shown in FIGS. 2(a) and 2(b) fills substantially all of the upper internal surface of the processing chamber 21. Also, as compared to the sonic box 8 shown in FIGS. 1(a) and 1(b), the sonic box 8' contains more transducers 9 and transmits sonic energy to the whole surface of the substrate 16 instead of only a part of it at a given time. Accordingly, there is no need to use a rotating chuck in the embodiment shown in FIGS. 2(a) and 2(b).

Figure 3:
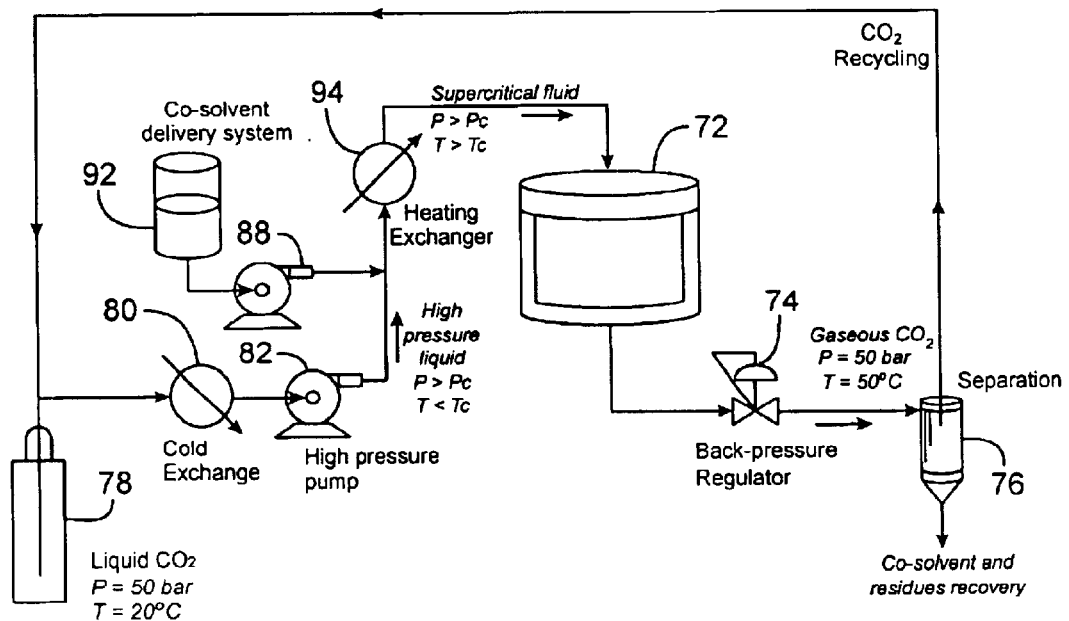
FIG. 3 shows a recycling system that can be used in embodiments of the invention.

FIG. 3 shows a system according to an embodiment of the invention. The system may include a substrate processing apparatus 72 and a recycling system. Exemplary temperatures and pressures are provided in FIG. 3. The substrate processing apparatus 72 may be the same or different than the substrate processing apparatus shown in FIGS. 1(a)–1(b), and 2(a)–2(b).

As shown in FIG. 3, a liquid $CO_2$ source 78 comprising, for example, liquid $CO_2$ and a co-solvent delivery system 92 may be provided in the system. During processing, co-solvent can be delivered to the substrate processing apparatus 72 using a pump 88 via a heat exchanger 94. Liquid $CO_2$ can be delivered to the substrate processing apparatus 72 via a cold exchanger 80 and using a high pressure pump 82. A back-pressure regulator 74 can regulate the back pressure of the fluid passing downstream of the substrate processing apparatus 72. A separator 76 is downstream of the substrate processing apparatus 72. The separator 76 can separate $CO_2$ while co-solvent and residues are recovered. As shown, the $CO_2$ can be recycled so that it can be used in the substrate processing apparatus 72 again.

Figure 4:
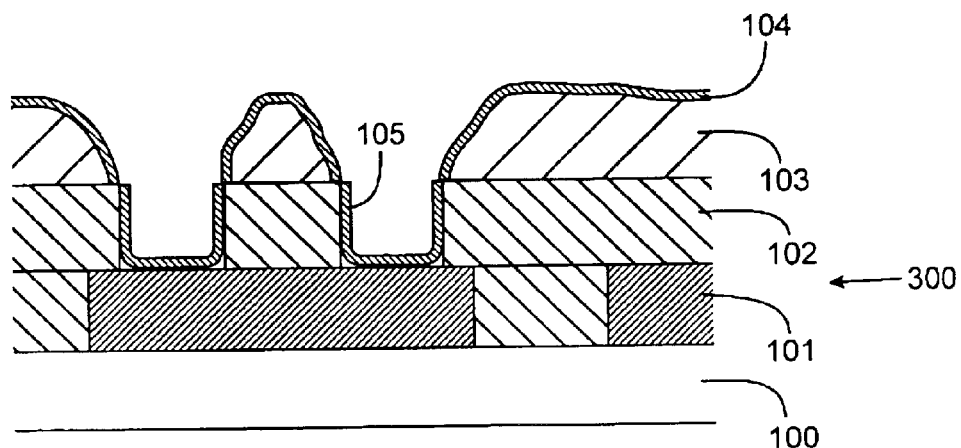
FIG. 4 shows a cross-section of a substrate with layers after dielectric etching.

An exemplary process for stripping organic residue on a porous dielectric material after etching with the substrate processing apparatus can be described with respect to FIGS. 1(a), 1(b), and 4.

A cross-section of the semiconductor substrate 300 is shown in FIG. 4. The semiconductor substrate 300 includes a metal layer 101 and a porous dielectric material 102 on a silicon wafer 100. For advanced technologies, the metal layer 101 can form interconnections between transistors (not shown) in the silicon wafer 100. The metal layer 101 may comprise a material such as aluminum or copper, and is insulated from other layers by a porous dielectric material 102.

The porous dielectric material 102 can be patterned by photolithography and plasma etching. Such methods are known to those of ordinary skill in the art. After plasma etching, organic residue 104, 105 generated by the plasma etching process deposits on top of the photoresist mask 103 and on the sidewalls of the dielectric material 102. The organic residue 104, 105 and the photoresist mask 103 can then be stripped using embodiments of the invention.

Referring to FIGS. 1(a) and 1(b), the substrate 300 is fixed on the edge gripper 7' inside the processing chamber 21. The processing chamber 21 is closed and a dense treatment fluid including a supercritical fluid and additives is introduced into the processing chamber 21 at a suitable pressure and temperature. The piezoelectric transducers 9 are activated and the rotating gripper 7 is activated. The combination of the sonic energy from the sonic box 25 and the movement of the dense treatment fluid by the rotating gripper 7 accelerates diffusion of the dense treatment fluid into the photoresist mask 103 and causes its dissolution. The combination also delaminates hardened organic residue 104, 105 and strips the residue 104, 105 off. The dense treatment fluid then passes downstream and carries the stripped material (e.g., in the form of particles) out of the processing chamber 21. Due to its low surface tension and viscosity, the dense treatment fluid also diffuses quickly and dissolves any residue deep inside the pores of the dielectric material 102. The substrate 300 is then rinsed with pure supercritical fluid in a subsequent step. Finally, pressure in the processing chamber 21 is decreased to the atmospheric pressure. The processing chamber 21 is opened and the substrate 300 is removed from it.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. For example, although the apparatus shown in FIG. 1(a) shows a rotating gripper that rotates a substrate during processing, it is understood that, as an alternative, the acoustic box could rotate to provide sonic energy to different parts of the substrate. Moreover, any one or more features of any embodiment of the invention may be combined with any one or more other features of any other embodiment of the invention, without departing from the scope of the invention. For example, the particular sonic box shown in FIG. 2(a) could be used with the particular rotating gripper shown in FIG. 1(a) without departing from the scope of the invention.

What is claimed is:

1. A method for processing a substrate, the method comprising:

a) introducing a substrate into a processing chamber;

b) introducing a dense phase gas into the processing chamber;

c) producing sonic energy substantially perpendicularly to the substrate inside of the processing chamber using a sonic box comprising a transducer coupled to a membrane, wherein the sonic box includes a body forming an enclosure and an incompressible liquid inside of the enclosure; and d) processing the substrate using the sonic energy and the dense phase gas.

2. The method of claim 1 wherein the dense phase gas includes a supercritical fluid or a liquefied gas.

3. The method of claim 1 further comprising:

e) rotating the substrate.

4. The method of claim 1 wherein the sonic box comprises a plurality of transducers attached to the membrane.

5. The method of claim 1 wherein the dense phase gas includes a supercritical fluid or a liquefied gas, wherein the supercritical fluid or liquidfied gas comprises carbon dioxide, dimethyl ether, ammonia, nitrous oxide, a light hydrocarbon, a halogenated hydrocarbon, or mixtures thereof.

6. The method of claim 5 wherein the dense phase gas further comprises an additive, wherein the additive comprises at least one of the following: organic solvents; eaters; ketones; lactones; ether; tertiary amines; di-substituted amides; ureas; acetates; tetrahydrofurane; dioxane; sulphoxides; sulfites; organic liquefied gases; oxidation agents; quaternary ammoniums; surfactants; chelating agents; and water.

7. The method of claim 1 further comprising:

recycling at least a portion of the dense phase gas back to the substrate processing apparatus.

8. The method of claim 1 wherein the processing chamber is maintained at a pressure between about 20 bar and about 500 bar.

9. The method of claim 1 wherein processing the substrate includes processing the substrate while the substrate is at a temperature between about 0° C. and about 150° C.

10. The method of claim 1 wherein the incompressible liquid comprises an oil.

11. The method of claim 1 wherein the substrate comprises a microporous material.

12. The method of claim 1 wherein the substrate includes a metal layer and a porous dielectric layer.

13. The method of claim 1, further comprising, prior to step a), patterning a porous dielectric material on the substrate using a plasma etching process.

14. The method of claim 1 wherein the sonic box comprises a linear arrangement of transducers and wherein the substrate rotates beneath the linear arrangement of transducers in step d).

15. The method of claim 1, further comprising, and after step d), rinsing the processed substrate with supercritical fluid.

* * * * *